US005118903A

United States Patent [19]

Schupp et al.

[11] Patent Number: 5,118,903

[45] Date of Patent: Jun. 2, 1992

[54] TIGHTLY-CLOSING HOUSING FOR AN ELECTRONIC CIRCUIT, PARTICULARLY FOR A CONTROL DEVICE OF AN INTERNAL COMBUSTION ENGINE

[75] Inventors: Karl Schupp, Pforzheim; Dieter Karr, Tiefenbronn, both of Fed. Rep. of Germany

[73] Assignee: Robert Bosch GmbH, Stuttgart, Fed. Rep. of Germany

[21] Appl. No.: 679,031

[22] PCT Filed: Sep. 28, 1990

[86] PCT No.: PCT/DE90/00741

§ 371 Date: May 17, 1991

§ 102(e) Date: May 17, 1991

[87] PCT Pub. No.: WO91/05451

PCT Pub. Date: Apr. 18, 1991

[30] Foreign Application Priority Data

Oct. 4, 1989 [DE] Fed. Rep. of Germany ....... 3933123

[51] Int. Cl.[5] .............................................. H05K 7/20

[52] U.S. Cl. .................................. 174/16.3; 361/388; 361/389

[58] Field of Search ............... 174/16.3; 361/386, 388, 361/389, 399

[56] References Cited

U.S. PATENT DOCUMENTS

| | | | |
|---|---|---|---|
| 3,869,563 | 3/1975 | Ocken, Jr. | 361/399 X |
| 3,904,262 | 9/1975 | Cutchaw . | |
| 4,409,641 | 10/1983 | Jakob et al. | 361/399 X |
| 4,679,118 | 7/1987 | Johnson et al. | 361/386 |
| 4,811,165 | 3/1989 | Currier et al. | 361/386 |
| 5,019,940 | 5/1991 | Clemens | 361/386 |
| 5,045,971 | 9/1991 | Ono et al. | 361/388 X |
| 5,053,923 | 10/1991 | Niemetz | 361/388 |

FOREIGN PATENT DOCUMENTS

| | | |
|---|---|---|
| 335783 | 3/1989 | European Pat. Off. . |
| 2546334 | 4/1977 | Fed. Rep. of Germany . |
| 2328353 | 5/1977 | France . |
| 2634617 | 1/1990 | France . |
| 1552317 | 9/1979 | United Kingdom . |
| 2197755 | 5/1988 | United Kingdom . |

*Primary Examiner*—Morris H. Nimmo

*Attorney, Agent, or Firm*—Michael J. Striker

[57] ABSTRACT

The housing for an electronic circuit provided with a connection plug, particularly for control electronics of an internal combustion engine of a vehicle, includes a frame, to which a printed circuit board having the electronic circuit is fastened, and a heat sink, the power components of the electronic circuit being positionally adjacent the heat sink so as to be able to transfer heat to the heat sink during operation of the electronic circuit board. The frame is constructed as an injection molded plastic frame (2) with a heat sink (14) including at least one built-in heat conducting crosspiece (13) having one end (15) and another end (17). The one end (15) has a component assembly surface (16) located in the housing interior and the other end (17) is constructed as a heat removing element (18) extending from the frame (2) toward the exterior (FIGS. 1 and 2). The power components are located next to the component assembly surface (16).

10 Claims, 2 Drawing Sheets

16 14 24 23 9 2 24 20 19 18 20 19 17 25 23 18 22 15 27 24 21 10 13 25 12 23 24 28 26 11

2
9
10
11
12
13
14
15
16
17
18
19
20
21
22
23
24
25
26
27
28

7
1
5
29
30
3
2
26
8
28
6
4
31

32
2
7

8
33

2

36
23
38
37
34
35

TIGHTLY-CLOSING HOUSING FOR AN ELECTRONIC CIRCUIT, PARTICULARLY FOR A CONTROL DEVICE OF AN INTERNAL COMBUSTION ENGINE

BACKGROUND OF THE INVENTION

The invention relates to a housing for an electronic circuit provided with a connection plug, particularly for control device electronics of an internal combustion engine of a vehicle, comprising a frame, to which a printed circuit board with the electronic circuit is fastened, and a heat sink to which the power components of the electronic circuit are assigned, as well as a cover enclosing the printed circuit board.

Housings for electronic circuits which are exposed to environmental influences must close tightly. Costly constructions with sealing inserts are known. An electronic control device with a housing having a cooling frame is known from DE-PS 25 46 334. The cooling frame has a base on which heat-generating components of a power stage are located. The cooling frame requires a metal section of relatively complicated construction. The known version is therefore quite cost-intensive. Since the cooling frame is covered by a hood-like cover, it must be taken into account in the design that the heat losses generated by the power stage are conducted away to such a degree that no impermissible heating occurs.

SUMMARY OF THE INVENTION

In contrast, the invention has the advantage that a tightly closing housing is provided in a very simple, economical construction which has excellent heat dissipating properties for heat-producing components. The frame comprises an injection-molded plastic frame having at least one heat conducting crosspiece of at least one heat sink. The heat conducting crosspiece is embedded in the plastic injection molding process during production so as to ensure a tight construction which is free of gaps. One end of the heat conducting crosspiece passes into a component assembly surface located in the interior of the housing and the other end of the heat conducting crosspiece is constructed as a heat removing element located outside the housing. The heat generated by the components arranged on the component assembly surface is therefore guided out of the housing interior directly via the embedded heat conducting crosspiece, so that excellent cooling properties exist. A heat dissipation is effected outside of the housing by the heat removing element, wherein the component assembly surface, heat conducting crosspiece and heat removing element are preferably constructed so as to form one piece, so that there is extremely low heat transmission resistance. In spite of a tightly closing housing, a particularly effective removal of heat is ensured in this manner. The plastic frame is a particularly simple and economical solution. The heat sink preferably consists of metal.

A double function is taken on by the heat removing element when the latter is simultaneously constructed as a housing fastening connection. Moreover, the heat removing properties are further improved, since the heat transported by the heat conducting web is absorbed or conducted further via the fastening, so that heat accumulations are avoided.

In particular, the housing fastening connection is a flange provided with a bore hole for a fastening element. The heat guided to the flange can therefore be transmitted to a supporting construction or the like via the fastening element. Insofar as the housing receives control device electronics for an internal combustion engine, the heat generated by corresponding power semiconductors is conducted off to the chassis or the body of the motor vehicle via fastening elements constructed e.g. as threaded screws. This leads to outstanding cooling properties. Since the electronic circuit must be connected to supply and data lines, a connection plug is provided. The latter can be secured on the housing in a particularly simple manner if it is formed into the plastic frame. Consequently, both the heat conducting crosspiece of the heat sink and the connection plug are injection molded with plastic during production of the frame. Accordingly, a gap-free transition to the plastic is also ensured in the connection plug.

According to a preferred embodiment of the invention, the plastic frame has snap-in projections which are injection molded on and can lock into bore holes of the printed circuit board. The printed circuit board can accordingly be fixed at the plastic frame by a simple snap-in connection. When assembling, the printed circuit board is assigned to the snap-in projections, which are constructed so as to form one piece with the plastic frame, in such a way that the snap-in connections are aligned with the bore holes. The snap-in connection is then effected. It is also conceivable that correspondingly constructed snap-in projections engage behind the circumferentially extending edge of the printed circuit board.

In addition or alternatively, the printed circuit board can also be held by metal pins which are formed into the plastic frame and engage in bore holes of the printed circuit board. The metal pins are preferably bent in such a way that they are prevented from slipping out of the bore holes. A particularly durable connection is provided when the metal pins hold the printed circuit board after being suitably bent preferably until the soldering process of the printed circuit board is performed. A securing solder connection between the pins and the printed circuit board is produced subsequently by the soldering process. For this purpose, the bore holes of the printed circuit board preferably are located in metallic or metallized areas, particularly conductor paths, so that a highly loadable soldering connection can be formed.

The cover is preferably formed by two plastic housing shells which are connected, preferably welded, with the upper and lower sides of the plastic frame. A tightly closing housing is realized in a particularly simple manner by the welding. Welding can be effected in one work step, e.g. in the Plister process wherein the two plastic housing shells are connected with the plastic frame of closing corresponding tools and heating the tool die.

In order to achieve a high electromagnetic compatibility (EMC), so that no outward or inward interference radiation occurs from or into the electronic circuit, the plastic housing shells are preferably metallized.

BRIEF DESCRIPTION OF THE DRAWING

The objects, features and advantages of the present invention will now be illustrated in more detail by the following detailed description, reference being made to the accompanying drawing in which.

DESCRIPTION OF THE EMBODIMENT EXAMPLES

Figure 1:
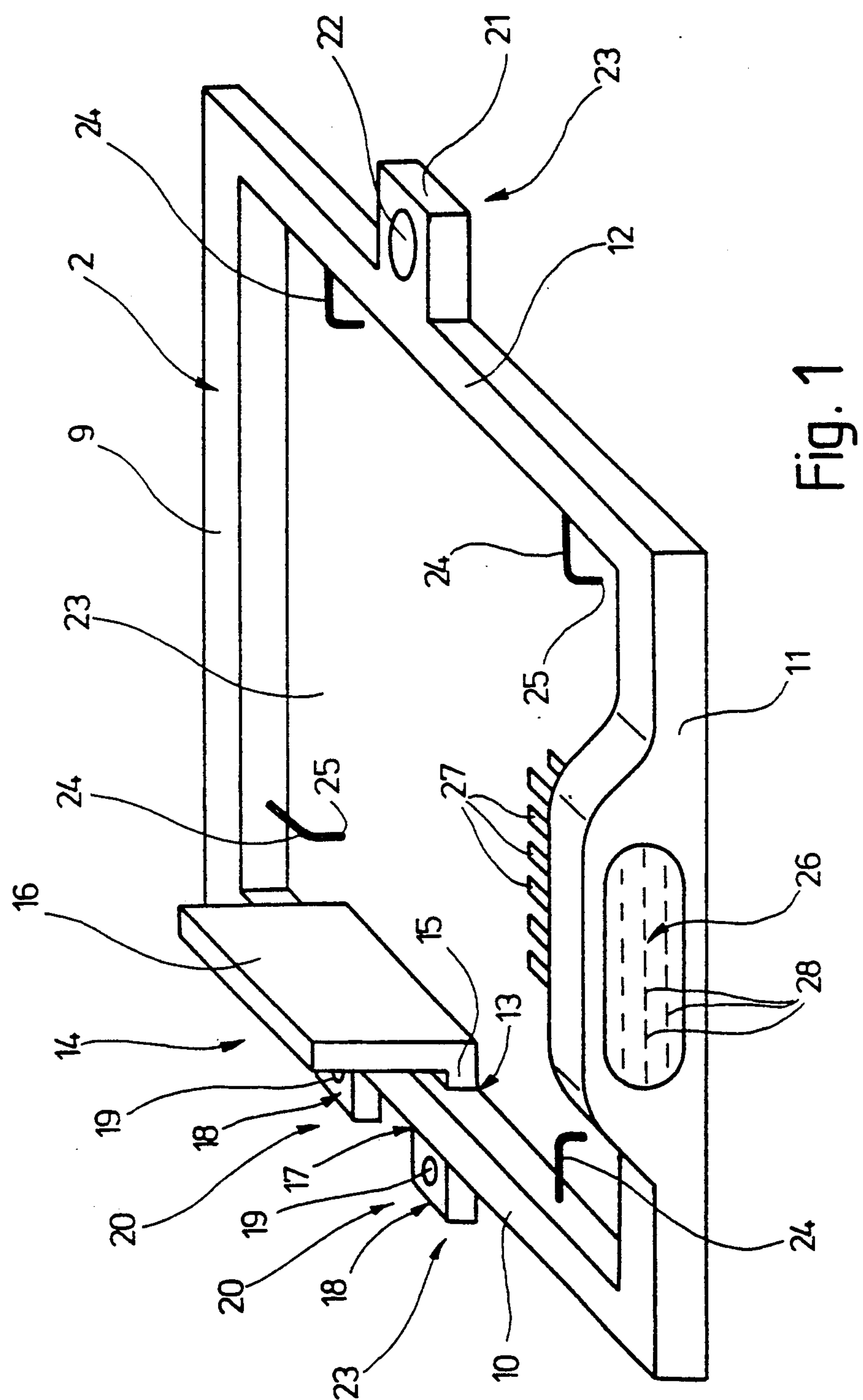
FIG. 1 shows a perspective view of a housing frame consisting of plastic, a printed circuit board is fastened to the housing frame which has a formed in heat sink as well as a formed in connection plug.
Figure 2:
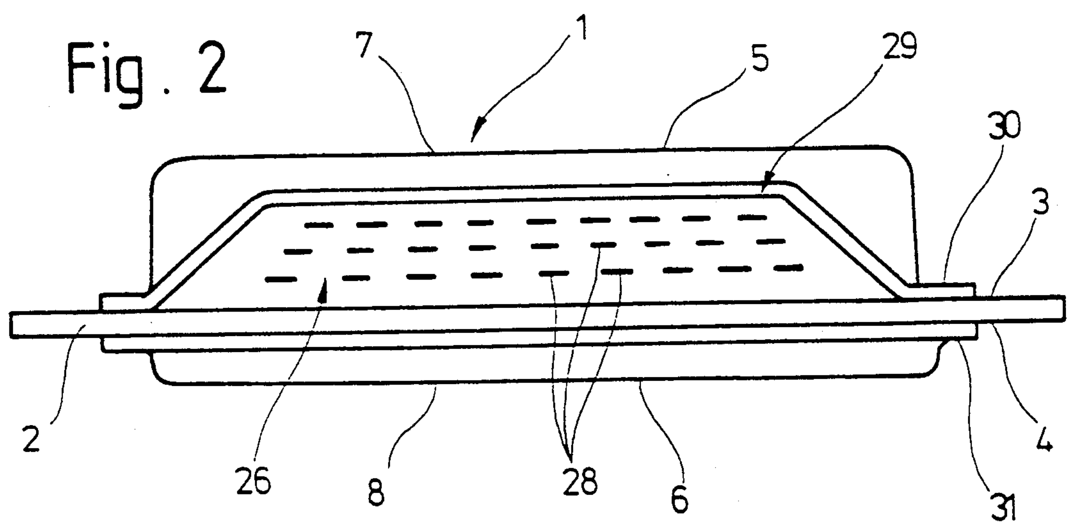
FIG. 2 shows a side view of a housing, according to the invention, having a cover consisting of two plastic shells.

According to FIGS. 1 and 2, the housing 1, according to the invention, comprises a closed plastic frame 2 which is produced with the injection molding technique. Two plastic housing shells 5 and 6 are fastened on the upper side 3 and the lower side 4 of the plastic frame 2. The plastic housing shell 5 forms a trough-shaped, relatively deep upper shell 7 and the plastic housing shell 6 is constructed as a lower shell 8 which is likewise trough-shaped, but flatter.

The plastic frame 2 will first be discussed in the following. According to FIG. 1, this plastic frame 2 comprises four frame legs 9, 10, Il and 12 which are connected with one another so as to form one piece. A heat conducting crosspiece 13 of a heat sink 14 is embedded in the frame leg 10. The heat conducting crosspiece 13 is thus injection molded with plastic during the production of the plastic frame 2. One end 15 of the heat conducting crosspiece 13 has an angled component assembly surface 16 in the interior of the frame. The other end 17 of the heat conducting crosspiece 13 is connected in one piece with a heat removing element 18 situated outside the plastic frame 12. The heat sink 14 shown in the embodiment example of FIG. 1 comprises two heat conducting crosspieces 13 which have the component assembly surface 16 and are both formed into the frame leg 10 and have a heat removing element 18 at their ends 17. The heat removing elements 18 have a bore hole 19 for fastening elements in each instance, so that they form fastening connections 20 for the plastic frame 2 and accordingly for the housing 1. A fastening can be effected at a suitable mounting location by suitable fastening elements which engage in the bore holes 19.

Further, brackets 21 which are injection molded on and provided with fastening bore holes 22 (see frame leg 12 in FIG. 1) can be constructed at the plastic frame 2 for the purpose of a fastening. Since the fastening connections 20 and also the brackets 21 project out over the frame periphery, flanges 23′ are formed by these elements, which flanges 23′ enable a particularly simple assembly of the housing 1.

A printed circuit board 23 having an electronic circuit, preferably control device electronics (not shown), is fastened at the frame legs 9, 10, 11 and 12. The printed circuit board 23 is located either in the interior of the frame or it is arranged at the lower side 4 of the plastic frame 2 in such a way that no frame parts project out over the lower side of the printed circuit board 23. Built-in metal pins 24 are provided in the plastic frame 2 for the purpose of fastening, which metal pins 24 engage in bore holes 25 of the printed circuit board 23 and hold the latter after being appropriately bent which is effected on the lower side of the printed circuit board. Metallic/metallized areas, particularly conductor paths, are assigned to the bore holes 25, so that the printed circuit board is held until a soldering process by the bent metal pins 24 and there is a secure connection between the metal pins 24 and the printed circuit board 23 after soldering.

However, as an alternative, it is also possible for the printed circuit board 23 to be held on the plastic frame 2 by screws.

Since the electronic circuit of the printed circuit board 23 must be connected to supply and data lines, a connection plug 26 is provided which is embedded in the frame leg 11 of the plastic frame 2. It is injection molded with plastic during the production of the plastic frame 2 so as to ensure a sealing which is free of gaps. The contact lugs 27 of the contacts 28 of the connection plug 26 are connected in a suitable manner with the electronic circuit arranged on the printed circuit board 23. The latter comprises heat-producing power components (not shown) which are arranged on the component assembly surface 16 of the heat sink 14 with the lowest possible heat transfer resistance.

According to FIG. 2, it is also possible, as an alternative, to arrange the connection plug 26 on the upper side 3 of the plastic frame 2. The upper shell 7 of the housing 1 has an edge 29 which is adapted in shape and contacts the upper side of the connection plug 26 so as to close tightly.

Upper shell 7 and lower shell 8 have angled edge members 30 and 31 which are welded with the upper side 3 and lower side 4 of the plastic frame 2 in a circumferentially extending manner. This is preferably carried out in one work step, specifically in the so-called plister process, wherein the two plastic housing shells 5 and 6 are tightly welded with the plastic frame 2 by closing a suitable tool with heated tool die.

To achieve a high electromagnetic compatibility, the plastic housing shells 5 and 6 are provided with a metallization. For this purpose, they are either metallized or equipped with a metal insert. They can be produced in the injection molding process or in the deep-drawing process.

When assembling, the lower shell 8 is first placed in a tool, then the plastic frame 2 with the printed circuit board 23 fastened to it is placed against the lower shell 8 in a position which is aligned by means of suitable joining means and the housing is finally completed by attaching the upper shell 7.

In the production of the frame/printed circuit board unit, so-called printed circuit board panels are preferably used, a plurality of plastic frames 2 being located on the latter, so that a plurality of printed circuit boards can be moved over a soldering bath simultaneously by the metal pins 24 described above. After soldering, the individual printed circuit boards 23 with the plastic frames 2 fastened thereon are broken or punched out of the printed circuit board panels. Production is accordingly particularly economical.

Figure 3:
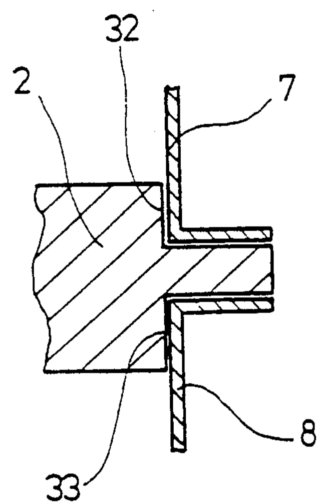
FIG. 3 is a detail of a sectional view of the fastening zone of the plastic housing shells at the plastic frame.

FIG. 3 shows that the plastic frame 2 can be constructed in a stepped manner in the fastening area with the plastic housing shells 5 and 6. The upper shell 7 engages in one step 32 and the lower shell 8 engages in the other step 33. The connection area between the shells and the frame is accordingly constructed so as to have a particularly large surface area, so that an absolutely tight connection is formed in welding. Cementing can also take the place of welding.

Figure 4:
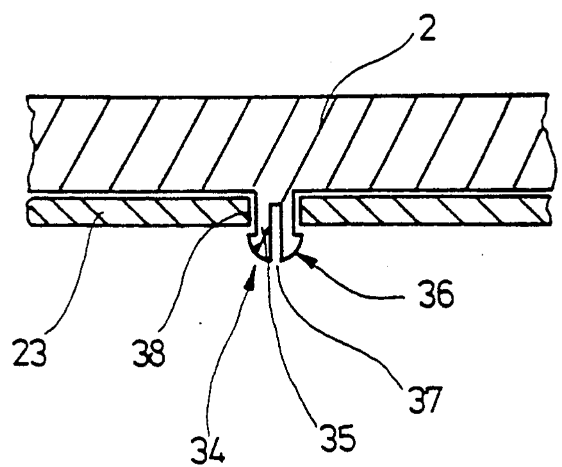
FIG. 4 is a sectional view of a plastic frame portion for fastening the printed circuit board, which plastic frame portion is constructed with a snap-in projection.

As an alternative to the printed circuit board fastenings already described, it is also possible, according to FIG. 4, that the plastic frame 2 comprises snap-in projections 34 which are injection molded on in one piece. Every snap-in projection 34 comprises a prong 35 which has a head-shaped end area 36. The head area 36 and prong 35 are provided with a slot 37. The printed circuit board 23 has bore holes 38 which are adapted to the diameter of the prong 35. In order to fasten the printed circuit board 23, the bore holes 38 of the latter are pressed on the snap-in projections 34, wherein, as a result of the slot 37 of the head-shaped end area 36, the diameter of the latter is reduced so that the prong 35 can engage in the bore hole 38. The end area 36 springs apart again in the attached state, so that the printed circuit board 23 is engaged from behind.

While the invention has been illustrated and described as embodied in a tightly-closing housing for an electronic circuit, particularly for a control device of an internal combustion engine, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed is new and desired to be protected by Letters Patent is set forth in the appended claims:

1. In a housing for an electronic circuit provided with power components, particularly for control electronics of an internal combustion engine of a vehicle, comprising a frame, to which a printed circuit board having the electronic circuit is fastened, and a heat sink, the power components of the electronic circuit being positionally adjacent said heat sink so as to be able to transfer heat to said heat sink during operation of the electronic circuit, and a cover which encloses the printed circuit board, the improvement wherein the frame is constructed as an injection molded plastic frame (2) with a heat sink (14) including at least one built-in heat conducting cross-piece (13) having one end (15) and another end (17), wherein the one end (15) has a component assembly surface (16) located in a housing interior and the other end (17) is constructed as a heat removing element (18) extending from the frame (2) toward the exterior.

2. The improvement as defined in claim 1, wherein the heat removing element (18) is constructed as a housing fastening connection (20).

3. The improvement as defined in claim 2, wherein the housing fastening connection (20) comprises a flange (23') provided with a bore hole (19) for a fastening element.

4. The improvement as defined in claim 1, further comprising a connection plug (26) for the electronic circuit built into the injection molded plastic frame (2).

5. The improvement as defined in claim 4, wherein the plastic frame (2) includes injected molded snap-in projections (34) which can snap into bore holes (38) provided in the printed circuit board (23).

6. The improvement as defined in claim 4, further comprising metal pins (24) built-in the injection molded plastic frame (2), said metal pins engaging in bore holes (25) provided in the printed circuit board (23) and being bendable to hold the printed circuit board (23) in place.

7. The improvement as defined in claim 1, wherein the injection molded plastic frame (2) has upper and lower sides (3,4) and the cover comprises two plastic housing shells (5,6) connected with the upper and lower sides (3,4) of the injection molded plastic frame (2).

8. The improvement as defined in claim 7, wherein the plastic housing shells (5,6) are metallized.

9. The improvement as defined in claim 7, wherein the plastic housing shells (5,6) are connected to the upper and lower sides (3,4) of the plastic frame (2) by welding.

10. The improvement as defined in claim 6, wherein the bore holes (25) are provided in metallized areas of the printed circuit board (23) and said metal pins (24) in the bore holes (25), which are bent to hold the circuit board in place, are secured to the metallized areas of the circuit board by soldering.

* * * * *